United States Patent
Frey et al.

(10) Patent No.: US 6,655,834 B1
(45) Date of Patent: Dec. 2, 2003

(54) SENSOR, IN PARTICULAR THERMAL SENSOR, AND METHOD FOR MANUFACTURING A LARGELY SELF-SUPPORTING MEMBRANE

(75) Inventors: Wilhelm Frey, Palo Alto, CA (US); Karsten Funk, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/613,131

(22) Filed: Jul. 10, 2000

(30) Foreign Application Priority Data

Jul. 10, 1999 (DE) .......................... 199 32 308

(51) Int. Cl.$^7$ .................. G01K 7/02; H01L 35/00
(52) U.S. Cl. .............. 374/179; 374/178; 136/225; 136/233
(58) Field of Search ................ 374/121, 179, 374/178; 250/338.1; 136/224, 225, 227, 233

(56) References Cited

U.S. PATENT DOCUMENTS

| | | | |
|---|---|---|---|
| 5,081,359 A | * 1/1992 | Pompei | 374/121 |
| 5,193,911 A | * 3/1993 | Nix et al. | 374/121 |
| 5,288,147 A | * 2/1994 | Schaefer et al. | 136/225 |
| 5,560,711 A | * 10/1996 | Bu | 374/179 |
| 5,572,059 A | * 11/1996 | Walker et al. | 250/338.1 |
| 5,939,971 A | * 8/1999 | Yong | 338/15 |
| 6,238,085 B1 | * 5/2001 | Higashi et al. | 374/179 |
| 6,305,840 B1 | * 10/2001 | Kim et al. | 136/225 |
| 6,335,478 B1 | * 1/2002 | Chou et al. | 136/225 |
| 6,448,557 B2 | * 9/2002 | Oda | 250/338.1 |

FOREIGN PATENT DOCUMENTS

| | | |
|---|---|---|
| DE | 44 18 163 | 11/1995 |
| DE | 198 43 984 | 3/2000 |

OTHER PUBLICATIONS

A. Oliver et al., "A 1024–element bulk–micromachined thermpoile infrared imaging array", (1999) pp. 222–231.

* cited by examiner

Primary Examiner—Diego Gutierrez
Assistant Examiner—Madeline Gonzalez
(74) Attorney, Agent, or Firm—Kenyon & Kenyon

(57) ABSTRACT

A sensor, in particular thermal sensor, having a silicon element and a largely self-supporting membrane layer equipped with at least one sensor element, is proposed. The membrane layer is furthermore spaced away from the silicon element by way of at least one contact column and is at least largely supported thereby. The contact column moreover makes electrical contact to the sensor element. Also proposed is a method for manufacturing a largely self-supporting membrane, a polymer layer first being deposited on a base element, patterned, and equipped with at least one cutout. The cutout is subsequently filled with a filler material, and a membrane layer is applied onto the polymer layer. Lastly, the polymer layer is removed again. The proposed method for manufacturing a largely self-supporting membrane layer is suitable in particular for constructing a sensor, in particular a thermal sensor or a thermal sensor array.

11 Claims, 1 Drawing Sheet

SENSOR, IN PARTICULAR THERMAL SENSOR, AND METHOD FOR MANUFACTURING A LARGELY SELF-SUPPORTING MEMBRANE

FIELD OF THE INVENTION

The present invention relates to a sensor, in particular a thermal sensor, and a method for manufacturing a largely self-supporting membrane in connection with the sensor.

BACKGROUND INFORMATION

Thermal sensors are used to measure radiation or flows, and operate on the thermoelectric, pyroelectric, or thermoresistive principle. Micromechanical infrared sensors are obtained principally by wet etching of silicon wafers in anisotropic etching media. Reference is made in this connection, for example, to A. Oliver and K. Wise, Sensors & Actuators, 73 (1999), pages 222 to 231.

Alternatively, it has already been proposed in German Published Patent Application No. 198 43 984 to perform a-chip-surface-economizing anisotropic dry etching of the rear side of the wafer, or to use a purely surface-micromechanical patterning process, for example with a technique based on porous silicon.

The purpose in all instances is to manufacture an at least largely self-supporting membrane with poor thermal conductivity, in addition to a heat sink, for example the wafer "mainland," in order, by way of suitable thermal pairs, to generate a temperature gradient, brought about for example by thermal radiation, between a thermally well-insulated and thus hot contact on the membrane on the one hand, and a cold contact, anchored on the mainland or connected thereto, on the other hand, and to measure it. The thermocurrent occurring in this context is then an indication of the absorbed quantity of radiation.

Known thermal sensors and the necessary associated electronic analysis systems are moreover usually of hybrid construction, i.e. the actual sensor element is separate from the electronic analysis system and is joined to it, for example, via bonding wires; or the sensor element is located, for example, as a layer on a ceramic substrate that serves at the same time as support for the electronic analysis system. A hybrid configuration offers definite cost advantages in the case of individual sensors.

In the field of interior sensing of motor vehicles, security technology, and residential automation, there is an increasing need for sensor arrays with greater and greater resolution. The spacing between the individual sensor elements that form the array must therefore continuously be decreased. When known sensor elements are used, however, the result is that connection of the individual sensor elements to the associated analysis and compensation circuits, for example by wire bonding, becomes more and more complex and laborious in terms of production engineering.

A first approach to an improved manufacturing method for micromechanical structures and sensor elements, the so-called "additive lost form" technique, has already been proposed in German Published Patent Application No. 44 18 163. In this, firstly a metallic layer and a patterned sacrificial polymer—equipped, for example by plasma etching, with openings—are applied as the polymer form onto a silicon wafer having an active electronic circuit. A metal pattern is then grown on in the region of the openings that were created, and lastly the sacrificial polymer is removed so that the grown metal patterns remain behind.

SUMMARY OF THE INVENTION

The present invention for manufacturing a largely self-supporting membrane, in particular for manufacturing a vertically integrated thermal sensor array having that membrane, has the advantage over the existing art of making possible a considerable simplification of the electronic control of the individual sensor elements on the membrane that is created. In particular, wiring is not necessary, and high densities of thermopiles or sensor elements can be achieved on the membrane layer. This allows a sensor array according to the present invention to have high spatial resolutions with simple electronic control.

In addition, the largely self-supporting membrane that is produced makes possible very good and defined thermal insulation between the base element located therebeneath and the membrane or the sensor elements located thereon, which can be interrupted locally by the contact columns that are produced.

In addition, it is advantageously possible to utilize established process technologies, facilities, and materials for the individual process steps, which yields cost and quality advantages.

It is particularly advantageous, in the case of the configuration of a thermal sensor or thermal sensor array, if the largely self-supporting membrane layer that is produced is made of a material with poor thermal conductivity as compared to a metal, in particular silicon nitride. It is thereby possible, by way of the contact columns that are produced, which advantageously are made of a material with good thermal conductivity such as, for example, a metal, to generate heat sinks in controlled fashion in the region of the contact columns, so that a temperature gradient is created between the contact columns and the regions remote from the contact columns, and is maintained for a long period of time.

It is further advantageous if a thermopile arranged on the membrane layer has at least two thermocouples or thermoelectric elements connected in series, whose thermojunctions are alternatingly in contact directly with a thermal contact column and with the membrane layer. The overall result is to create in the thermopile a particularly large, easily measurable thermocurrent as a function of the temperatures of the individual thermojunctions. For example, thermal radiation locally incident on the thermopiles is thereby easily measurable in terms of its intensity, and can be analyzed in terms of lateral intensity differences over the membrane layer with a high lateral resolution of up to 5 $\mu$m.

DETAILED DESCRIPTION

Figure 1:
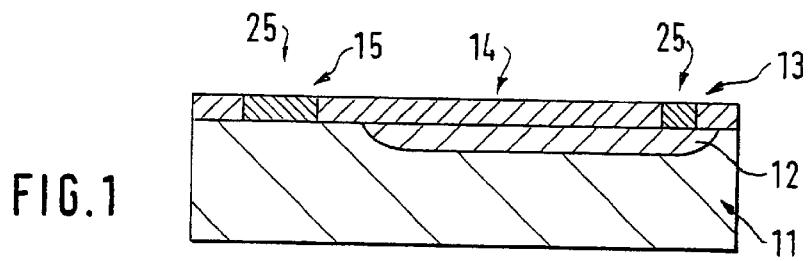
FIG. 1 shows a silicon element having an integrated electronic circuit during one process step.
Figure 3:
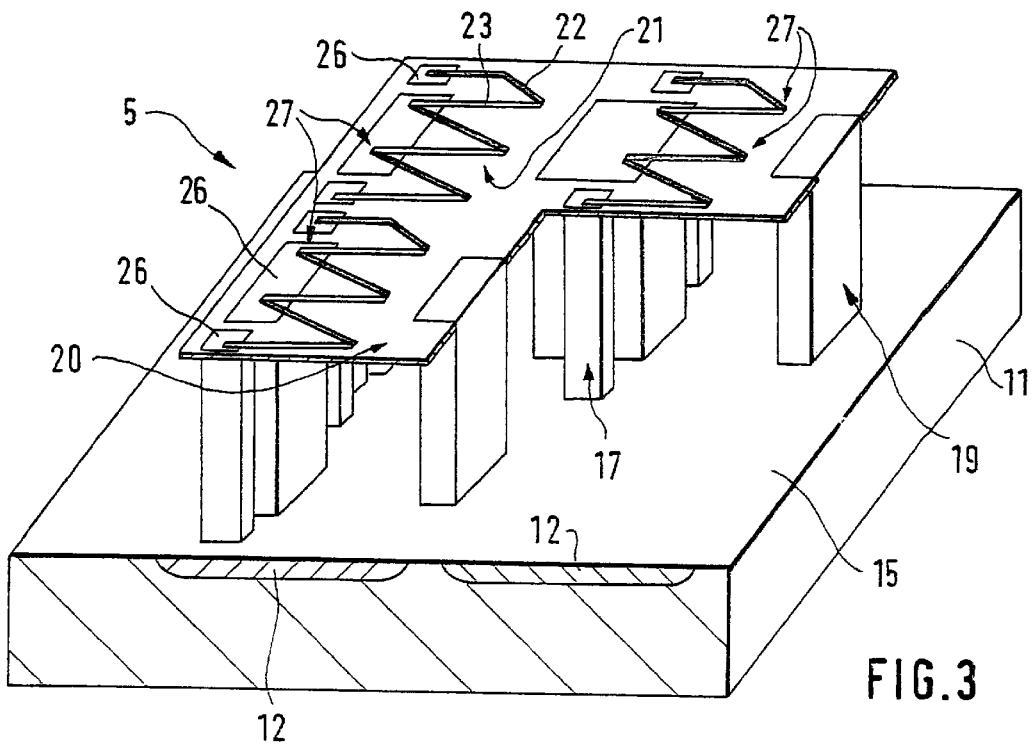
FIG. 3 shows a thermal sensor array that was manufactured with the method explained by way of FIGS. 1 and 2.

FIG. 1, described with reference to the numbered items shown in FIG. 3, shows a silicon element 11, for example a silicon wafer, as base element, upon which, in the example explained, a vertically integrated thermal sensor array 5 having a plurality of thermopiles 21 as individual thermal sensors is to be produced.

For that purpose, firstly a finished integrated electronic circuit 12, locally accessible at the surface or equipped with connecting contacts, is produced for thermal sensor array 5 in order to convey and analyze the electronic signals and thermocurrents of the individual thermopiles 21.

Then an IC passivation in the form of a passivation layer 14 with a typical thickness of 10 nm to 5 $\mu$m, preferably 100 nm to 1 $\mu$m, which preferably is made of silicon nitride and serves to protect electronic circuit 12 and/or silicon element 11 from soiling, dust, oxidation processes, or diffusion processes, is applied onto silicon element 11 having electronic circuit 12.

After application, passivation layer 14 is additionally patterned in a known manner, for example photolithographically with a masking layer, and is opened or removed again in the usual fashion in the region of openings 25.

In a further process step, the regions of openings 25 are then, by way of suitable masks and deposition methods such as sputtering or metal evaporation methods and depending on their later function, on the one hand equipped in defined partial fashion with an electrical contact 13, and on the other hand equipped in defined partial fashion with a thermal substrate coupling 15. For that purpose, openings 25 are, for example, filled with a metal, for example, Co, Cu, Ni, Au, Pt, Ag, Al, Ti, Pd, or Pt.

For the case in which a sensor is to be produced using the method being explained, at least two electrical contacts 13 are used. The thermal substrate couplings 15 also provided in addition to electrical contacts 13 can optionally be dispensed with. This function can additionally be handled by electrical contacts 13.

In a given implementation, however, this process step can also be omitted if, as explained below, a deposition layer 16 (shown in FIG. 2) having a typical thickness of 5 nm to 5 $\mu$m, preferably 100 nm to 1 $\mu$m, is deposited, over the entire surface of silicon element 11, onto passivation layer 14 after it has been patterned and after the opening and removal of passivation layer 14 in the region of openings 25. This deposition layer 16 is preferably an electrically highly conductive material, in particular a metal such as Co, Cu, Ni, Au, Pt, Ag, Al, Ti, Pd, or Pt, and serves as a so-called "plating base" for an additionally utilized electroplating deposition process. In this case the thermal substrate couplings 15 and/or electrical contacts 13 are ensured and constituted by deposition layer 16.

In this context, electrical contacts 13 represent an electrically conductive and preferably also thermally conductive connection between electronic circuit 12 integrated into silicon element 11 and the sensor elements that are to be applied later. Analogously, thermal substrate couplings 15 create a preferably highly thermally conductive connection between the sensor elements to be applied later and silicon element 11, thermal substrate couplings 15 being electrically insulated with respect to integrated electronic circuit 12 or produced in regions in which electronic circuit 12 is absent. Preferably, they are in direct contact with silicon element 11.

Figure 2:
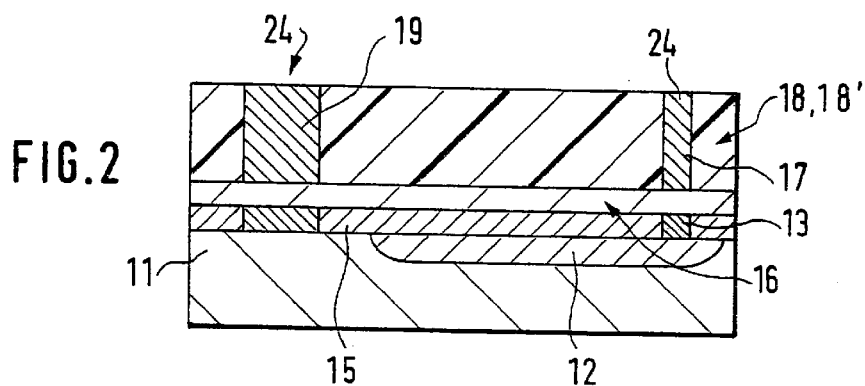
FIG. 2 shows the silicon element of FIG. 1 with additional layers and structures after further process steps.

FIG. 2 explains the process steps which follow FIG. 1. For that purpose, a polymer layer 18' made of a polymer 18, in particular a photoresist, that is thick by comparison with the thickness of deposition layer 16, is applied onto the full-surface deposition layer 16 of silicon element 11 that has been prepared according to FIG. 1. The thickness of polymer layer 18' is typically 0.1 $\mu$m to 50 $\mu$m, preferably 1 $\mu$m to 5 $\mu$m. This polymer layer 18' can be patterned in a manner such as photolithography, with corresponding masks, and then etched in the regions of cutouts 24 with an isotropic dry-chemical plasma etching method until deposition layer 16 is reached, thus creating a negative form for deposition of the columns.

Cutouts 24 and openings 25 are arranged in such a way that they lie at least largely one above another.

In the remainder of the method, polymer layer 18' serves as a so-called "lost-form" polymer.

Reference is made to German Published Patent Application No. 44 18 163 regarding further details, known to those skilled in the art, of the process steps explained by way of FIGS. 1 and 2.

After the creation of cutouts 24 in polymer layer 18', which for example can have a circular, square, or rectangular cross section and can extend depthwise as far as deposition layer 16, cutouts 24 are filled with a metal, in particular Co, Cu, =Ni, Al, Au, Pt, Ag, Ti, Pd, or Pt, using an electroplating deposition process. The result is to create electrical contact columns 17 and thermal contact columns 19. Electrical contact columns 17, are connected in electrically conductive and preferably also highly thermally conductive fashion via deposition layer 16 and electrical contact 13 to electronic circuit 12 and thermal contact columns 19 are connected in highly thermally conductive fashion via deposition layer 16 and thermal substrate coupling 15 to silicon element 11.

Contact columns 17, 19 furthermore serve as spacers between silicon element 11 and a membrane 20, largely self-supporting and supported or at least largely carried by contact columns 17, 19. In addition, they have the task of later making possible electrical contacting of a sensor element or array of sensor elements, arranged for example on this membrane layer 20, and ensuring connection and activation thereof via electronic circuit 12.

If only a largely self-supporting membrane is to be produced, one contact column 17, 19 is sufficient, in principle, to support the membrane. If, on the other hand, at least one sensor element is additionally to be arranged on the largely self-supporting membrane, then at least two electrical contact columns 17 are used.

In the instance in which thermopiles 21 are later to be constructed on membrane layer 20 so as to create thermal sensor array 5, contact columns 17, 19 further provide thermal coupling of the "cold" contacts of thermopiles 21 to silicon element 11 being used as the substrate. Thermal contact columns 19 can in principle be dispensed with in this context, but it is preferred to use them to construct a thermal sensor or thermal sensor array 5, since the resulting thermocurrents thereby become much larger, and a permanent temperature gradient between contact columns 17, 19 as heat sinks and the other regions of membrane layer 20 can be maintained.

After the electrical and thermal contact columns 17, 19 have been produced, membrane layer 20, which preferably is made of silicon nitride, is produced, for example using a low; temperature plasma method, at a thickness of 200 $\mu$m to 1 $\mu$m. Membrane layer 20 is then photolithographically patterned with a masking layer, and then removed again in the region of cutouts 24 with an etching technique, so that end faces 26 of contact columns 17, 19 are exposed and can additionally be electrically contacted.

In addition to silicon nitride, further materials that have poor thermal conductivity as compared to a metal and are electrically at least largely insulating, for example silicon dioxide, silicon carbide, or silicon oxycarbides, are also suitable as the material for membrane layer 20.

In a subsequent process step, residues of a masking layer remaining on membrane layer 20 are then removed, and polymer layer 18', acting as the "lost form" polymer, is incinerated, for example, in dry-chemical fashion in an $O_2$ plasma.

Alternatively, however, polymer layer 18' can also be removed using a wet-chemical process.

Deposition layer 16 is then also removed or etched away in the regions that are not masked by contact columns 17, 19.

Reference is once again made to German Published Patent Application No. 44 18 163 regarding further known details of the patterning, deposition, and etching methods used.

After the process steps explained above, an at least largely self-supporting membrane is now present in the form of membrane 20, which is spaced away from silicon element 11 and supported by contact columns 17, 19.

If membrane layer 20 is to serve as a support for sensor elements so that a vertically integrated sensor results, it is emphasized that configuration of the sensor elements on membrane layer 20 preferably precedes the removal of polymer layer 18'. In such a case, therefore, first the residues of the masking layer remaining on membrane layer 20 are removed, and then, in a continuation of the method explained above as shown in FIG. 3, the desired sensor elements are applied onto membrane layer 20. In one embodiment, these sensor elements are applied in regular fashion, and connected via electrical contact columns 17 to electronic circuit 12, in such a way as to form a sensor array.

The construction of a sensor array with sensor elements on membrane layer 20 will additionally be described using the example of a thermal sensor or a thermal sensor array 5. It is evident, however, that instead of a sensor array 5, a single sensor element can also be used to construct a sensor. Specifically, for that purpose firstly at least one thermopile 21 is applied onto membrane layer 20, thus creating a thermal sensor having an integrated electronic circuit and connecting contact.

Application of thermopiles 21 onto membrane layer 20 can be accomplished firstly by evaporating or sputtering, for example, aluminum as first thermomaterial 22 onto membrane 20, and by subsequent photolithographic patterning. Then polysilicon can be is preferably evaporated or sputtered onto membrane 20 as second thermomaterial 23, and is then also photolithographically patterned.

Evaporation or sputtering of first and second thermomaterials 22, 23, and photolithographic patterning, are in this context accomplished in such a way that first thermomaterial 22 and second thermomaterial 23 touch at least one point, thus creating a thermocouple or thermoelectric element having one thermojunction 27.

Preferably the evaporation or sputtering of first and second thermomaterials 22, 23 onto membrane layer 20 forms thermopiles 21 that each have a plurality of thermoelectric elements or thermojunctions 27 connected in series. These thermopiles 21 are furthermore each connected, at their two ends, to an electrical contact column 17, so that by way of them an electrical connection exists to the integrated electronic circuit 12, and analysis of the thermocurrents of thermopiles 21 is possible.

The electrical contacting of the ends of thermopiles 21 to end faces 26 of electrical contact columns 17 occurs because these end faces 26 are not covered by membrane layer 20 and are thus freely accessible. The evaporation and sputtering of first and second thermomaterials 22, 23 onto thermopiles 21 is accomplished in such a way that, for example, conductor paths are formed, which extend on the surface of membrane layer 20 and reach as far as end faces 26 of at least electrical contact columns 17 where they create an electrical contact between thermopile 21 and electronic circuit 12. For that purpose, the masking of the membrane layer and of the accessible end faces 26 of at least electrical contact columns 17 upon evaporation or sputtering of thermomaterials 22, 23 is performed appropriately. The conductor paths produced from the first and/or second thermomaterial 22, 23 have a typical width of 20 nm to 200 μm, preferably 200 nm to 5 μm, and a typical thickness of 10 nm to 10 μm, preferably 100 nm to 2 μm.

To produce a thermal sensor, it is evident from FIG. 3 that at least two electrical contact columns 17, which simultaneously carry membrane 20, are used. The presence of thermal contact columns 19, on the other hand, is not absolutely necessary. Preferably, however, one thermopile 21 is connected to at least two electrical contact columns 17 and at least one thermal contact column 19. In this connection, it should be emphasized that thermal contact columns 19 are preferably of much wider configuration, i.e. have a larger cross-sectional area, than electrical contact columns 17, so that a plurality of thermojunctions 27 can be arranged next to one another on one common thermal contact column.

In addition, thermojunctions 27, i.e. the contact points between first and second thermomaterials 22, 23, are arranged on membrane layer 20 in such a way that they are connected in thermally conductive fashion alternatingly directly with end face 26 of a thermal contact column 26 as heat sink (and thus cold region), and directly with a region of membrane layer 20. Since membrane layer 20 is made of a material having poor thermal conductivity as compared to thermal contact columns 19, in particular as compared to a metal, a definite temperature gradient forms between thermojunctions 27 located on thermal contact columns 19 and the adjacent thermojunctions 27 located on membrane layer 20.

Reference is made to German Published Patent Application No. 198 43 984 regarding further details of the construction and manufacturing method of thermopiles 21 and the functional principle of the thermal sensor.

Furthermore, thermopiles 21 can be are arranged on membrane layer 20 in the form of a regular arrangement of a plurality of thermopiles having a spacing of 1 μm to 500 μm. This spacing also defines, in particular, the spatial resolution of thermal sensor array 5 produced therewith.

What is claimed is:

1. A thermal sensor, comprising
a silicon element;
at least one contact column;
a largely self-supporting membrane layer including at least one sensor element, wherein the membrane layer is spaced from the silicon element by the at least one contact column and is largely supported by the at least one contact column, and wherein the at least one contact column forms an electrical contact with the at least one sensor element; and
an electronic circuit, wherein:
the at least one contact column corresponds to at least two electrical contact columns, and
the at least one sensor element is electrically connected via the at least two electrical contact columns to the electronic circuit;
wherein the at least one contact column includes thermal contact columns and electrical contact columns, wherein the at least one sensor element is electrically connected to the electronic circuit via the electrical contact columns, and wherein the at least one sensor element is electronically insulated from the electronic circuit by the thermal contact columns.

2. The sensor of claim 1, wherein the electronic circuit is integrated into the silicon element.

3. The sensor of claim 1, wherein:
the membrane layer includes a material that has a poor thermal conductivity with respect to a metal.

4. The sensor of claim 3, wherein the material is composed of silicon nitride.

5. The sensor of claim 1, wherein the thermal contact columns and the electrical contact columns are thermally connected to the at least one silicon element.

6. The sensor of claim 5, wherein one of thermal contact columns and a group including the thermal contact columns and the electrical contact columns form heat sinks with respect to the membrane layer and are made of a metal that includes one of Co, Cu, Ni, Au, Pt, Al, Ag, Ti, Pd, and Pt.

7. The thermal sensor of claim 1, wherein a plurality of contact columns are present, and at least one of the plurality of contact columns forms an electrical contact with the at least one sensor element.

8. A thermal sensor, comprising:

a silicon element;

at least one contact column; and a largely self-supporting membrane layer including at least one sensor elements, wherein the membrane layer is spaced from the silicon element by the at least one contact column and is largely supported by the at least one contact column, and wherein the at least one contact column forms an electrical contact with the at least one sensor element;

wherein the at least one sensor element is a thermopile that includes at least one of a thermocouple and a thermoelectric element, and wherein the thermopile includes:

a first thermomaterial, a second thermomaterial, and a thermojunction provided in at least single-point fashion.

9. The sensor of claim 8, wherein the thermopile includes one of at least two thermocouples and at least two thermoelectric elements connected in series and having respective thermojunctions, and wherein the thermojunctions are alternatingly directly in contact with one of the at least one contact column and with the membrane layer.

10. A thermal sensor, comprising:

a silicon element;

at least one contact column; and a largely self-supporting membrane layer including at least one sensor element, wherein the membrane layer is spaced from the silicon element by the at least one contact column and is largely supported by the at least one contact column, and wherein the at least one contact column forms an electrical contact with the at least one sensor element;

wherein the membrane layer is patterned such that end faces of the at least one contact column are not covered by the membrane layer.

11. A thermal sensor, comprising:

a silicon element;

at least one contact column;

a largely self-supporting membrane layer including at least one sensor element, wherein the membrane layer is spaced from the silicon element by the at least one contact column and is largely supported by the at least one contact column, and wherein the at least one contact column forms an electrical contact with the at least one sensor element; and a thermal sensor array formed from a plurality of regularly arranged thermopiles provided on the membrane layer.

* * * * *